United States Patent
Bracht et al.

(10) Patent No.: US 6,329,805 B1
(45) Date of Patent: Dec. 11, 2001

(54) METHOD FOR NETWORK ANALYZATION AND APPARATUS

(76) Inventors: Roger B. Bracht, 25969 Highway 4, Jemez Springs, NM (US) 87025; Regina V. Pasquale, 587 Grand Canyon, Los Alamos, NM (US) 87544

(*) Notice: Subject to any disclaimer, the term of this patent is extended or adjusted under 35 U.S.C. 154(b) by 0 days.

(21) Appl. No.: 09/515,298

(22) Filed: Feb. 29, 2000

(51) Int. Cl.$^7$ .............. G01R 23/16; G01R 27/02
(52) U.S. Cl. .............................................. 324/76.12
(58) Field of Search ...................... 324/76.12, 76.19, 324/76.21, 76.22, 76.23, 76.27, 602, 605, 606, 612, 617; 702/75, 76, 77; 370/478, 484; 455/67.1, 67.5, 67.6

(56) References Cited

U.S. PATENT DOCUMENTS

| | | | |
|---|---|---|---|
| 5,028,886 | * | 7/1991 | Seibel et al. ............................ 331/4 |
| 5,119,399 | * | 6/1992 | Santos et al. ......................... 375/10 |
| 5,524,281 | * | 6/1996 | Bradley et al. ..................... 455/67.3 |
| 6,184,692 | * | 2/2001 | Jindal .................................. 324/607 |
| 6,211,663 | * | 4/2001 | Moulthrop et al. ............... 324/76.23 |

\* cited by examiner

Primary Examiner—Safet Metjahic
Assistant Examiner—E P LeRoux
(74) Attorney, Agent, or Firm—DeWitt M. Morgan

(57) ABSTRACT

A portable network analyzer and method having multiple channel transmit and receive capability for real-time monitoring of processes which maintains phase integrity, requires low power, is adapted to provide full vector analysis, provides output frequencies of up to 62.5 MHz and provides fine sensitivity frequency resolution. The present invention includes a multi-channel means for transmitting and a multi-channel means for receiving, both in electrical communication with a software means for controlling. The means for controlling is programmed to provide a signal to a system under investigation which steps consecutively over a range of predetermined frequencies. The resulting received signal from the system provides complete time domain response information by executing a frequency transform of the magnitude and phase information acquired at each frequency step.

18 Claims, 3 Drawing Sheets

METHOD FOR NETWORK ANALYZATION AND APPARATUS

This invention was made with Government support Contract No. W-7405-ENG36 awarded by the United States Department of Energy to The Regents of the University of California. The Government has certain rights in the invention.

FIELD OF THE INVENTION

The present invention relates generally to network analyzers wherein at least one transmit signal is transmitted to a system being analyzed, and at least one receive signal is received from the system being analyzed, the transmitted signal being mixed with the receive signal to obtain the phase and amplitude data of the receive signal and performing calculations to obtain time domain response data.

BACKGROUND OF THE INVENTION

Several commercial products exist in the market today which are used to obtain similar information from a measured system (such as those manufactured by Hagtronics, Venable Industries and DKD Instruments). Such analyzers, however, only provide scalar information (and hence, are incapable of providing phase information), have a limited maximum frequency, are limited to a low number of transmit and receive channels and are costly. What is required is a small, multi-channel, wide-band network analyzer which maintains phase information, allows for inverse fast Fourier transforms to product time responses and is able to generate system information not discernable from the system's magnitude response alone.

Accordingly, it is an object of the present invention to provide a method for real-time network analysis of a system to determine the health or operational state of individual components forming the system and which allows prompt action to be taken in the event of a detected problem.

It is also an object of the present invention to provide a method for real-time analysis of a system which measures system responses using any arrangement of transmitters and receivers, measures system network phase and magnitude transfer functions, measures the transfer function of passive or active filters, measures closed-loop control system phase and magnitude, measures the system's DC gain, open loop bandwidth and phase margin of amplifiers, measures impedance versus frequency of selected system components, measures system resonances, characterizes phase lock loops, measures performance of nonlinear system components (such as signal mixers), determines the phase and noise characteristics of a system and measures other non-linear system characteristics.

It is a further object of the present invention to provide a multiple channel phase coherent, swept-frequency network analyzer which accurately maintains phase integrity of system data, provides enhanced measurement capabilities, is low cost, is small, requires low power for operation and is programmable in frequency, step size, bandwidth and gain.

It is a further object of the present invention to provide a network analyzer having a plurality of pure sinusoidal transmit and measurement channels, the network analyzer maintaining phase integrity between the transmitted signal and the measured signal so that an operational analysis can be executed on the measured signal.

It is also an object of the present invention to provide a network analyzer having a plurality of pure sinusoidal transmit and measurement channels, the network analyzer minimizing direct current drive while enhancing dynamic range of measurements.

It is a further object of the present invention to provide a network analyzer having a plurality of pure sinusoidal transmit and measurement channels, the network analyzer measuring predefined signals by mixing the received signal with a reference, phase-shifted transmit signal and the in-phase transmitted signal.

It is also an object of the present invention to provide a portable system analyzer which measures system responses using any arrangement of transmitters and receivers, measures system network phase and magnitude transfer functions, measures the transfer function of passive or active filters, measures closed-loop control system phase and magnitude, measures the system's DC gain, open loop bandwidth and phase margin of amplifiers, measures impedance versus frequency of selected system components, measures system resonances, characterizes phase lock loops, measures performance of nonlinear system components (such as signal mixers), determines the phase and noise characteristics of a system and measures non-linear system characteristics.

Additional objects, advantages and novel features of the invention will be set forth in part in the description that follows, and in part will become apparent to those of skill in the art upon examination of the following description or may be learned by practice of the invention. The objects and advantages of the invention may be realized and attained by means of the instrumentalities and combinations particularly pointed out in the appended claims.

SUMMARY OF THE INVENTION

The present invention is a small, portable, system or network analyzer and method having multiple channel transmit and receive capability for real-time monitoring of processes which maintains phase integrity, requires low power, is adapted to provide full vector analysis, provides output frequencies of up to 62.5 MHz and provides fine sensitivity frequency resolution. The present invention also provides a highly sensitive dynamic range response, allows for programmable phase and magnitude spectrum drive signal shaping, variable signal sweep speeds and low signal power for each of the transmit and receive channels employed. The present invention also maintains phase integrity between any signals transmitted to the system being analyzed and any response signals from the system so that time domain analysis can be executed on the recovered response signals.

The present invention includes a means for transmitting, software means for controlling and a means for receiving in electrical communication with the software means for controlling. The means for transmitting and the means for receiving include multi-channel multiplexer circuitry, thereby allowing analysis of multiple systems or networks. The means for controlling is programmed to provide a signal to a system under investigation which steps consecutively over a range of predetermined frequencies. The resulting received signal from the system provides a frequency response over the range of predetermined frequencies. Time response information is provided by taking a frequency transform of the magnitude and phase information acquired at each frequency step. The conversion back to the time domain would not be possible without using a device such as the present invention which maintains phase integrity.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

DETAILED DESCRIPTION OF THE INVENTION

Figure 1:
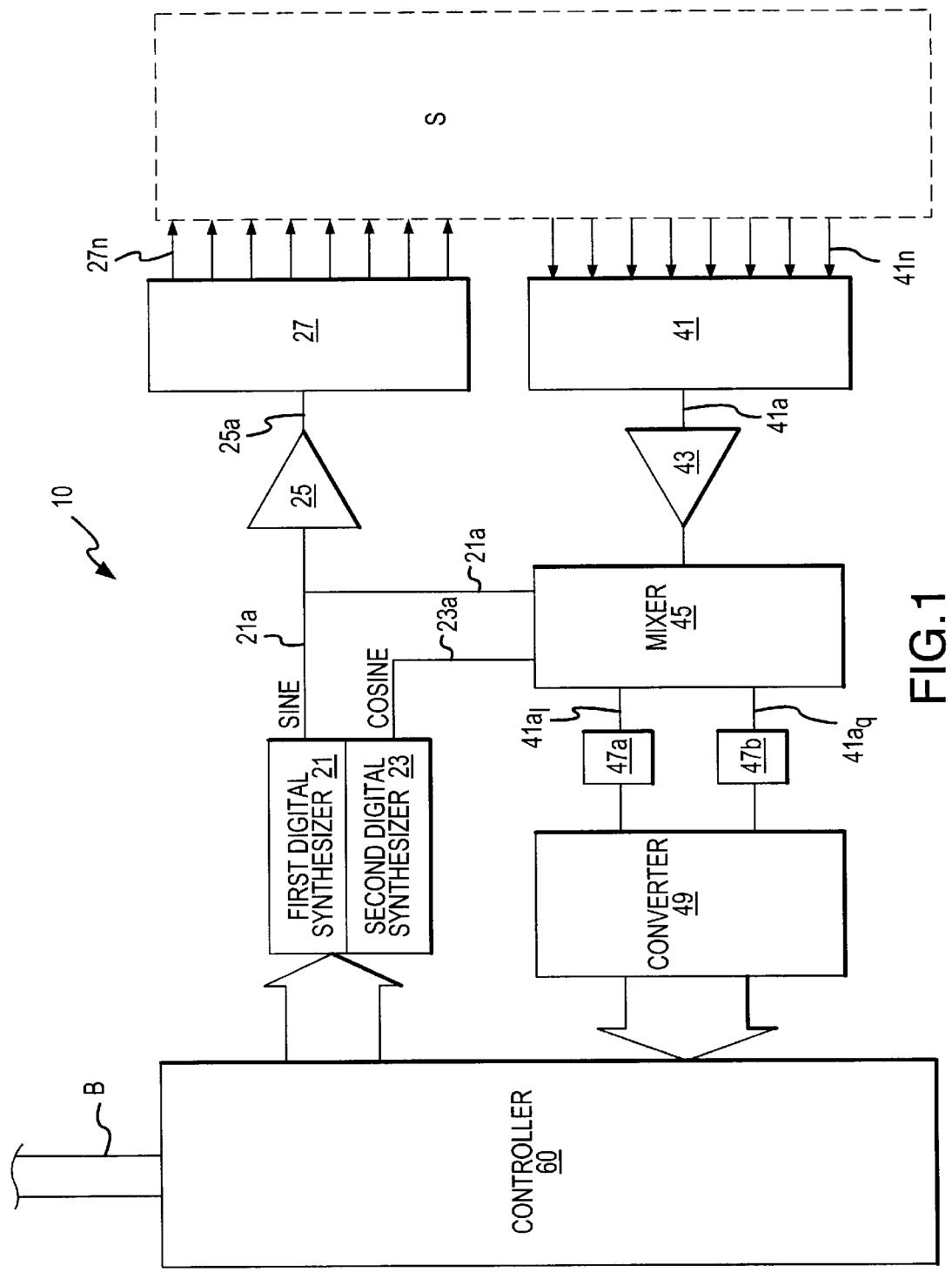
FIG. 1 is a graphical illustration of the preferred embodiment of the present invention.
Figure 2:
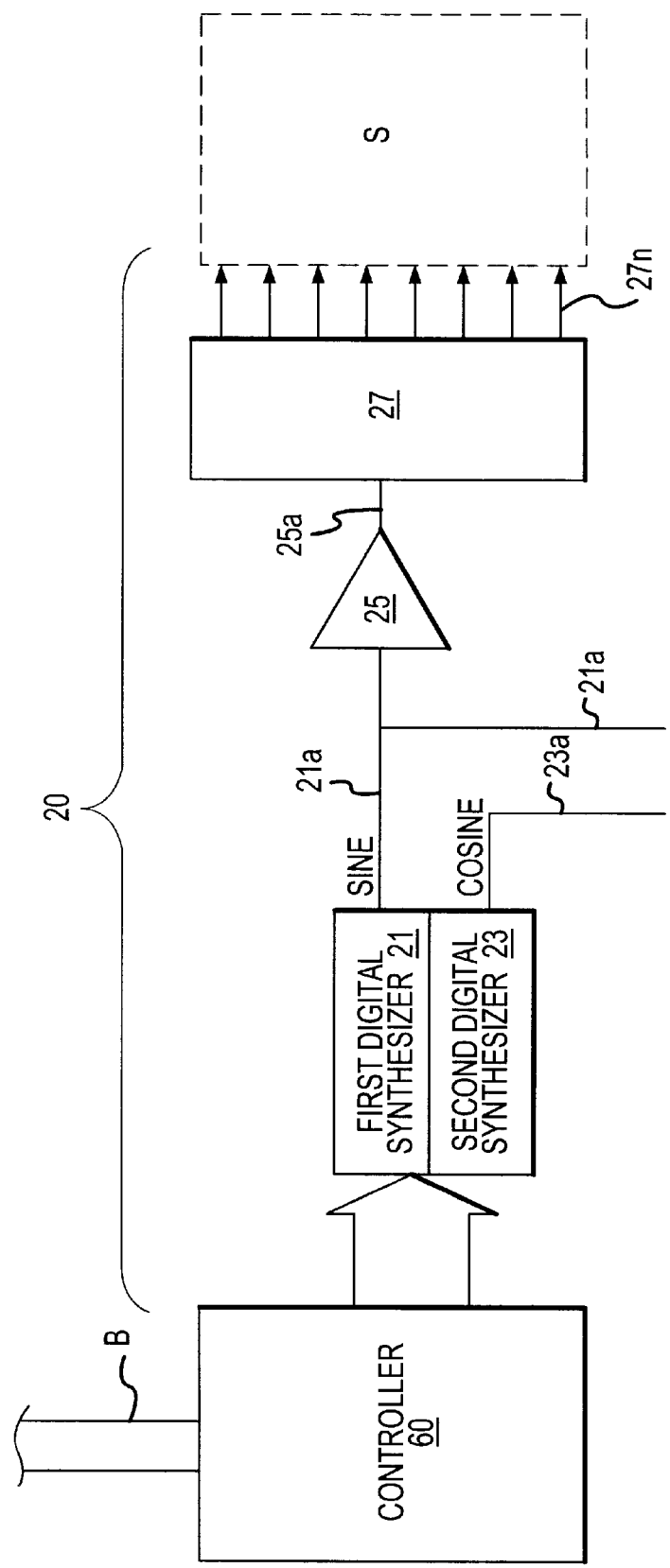
FIG. 2 is a graphical illustration of the means for transmitting as disclosed and claimed in the present invention.
Figure 3:
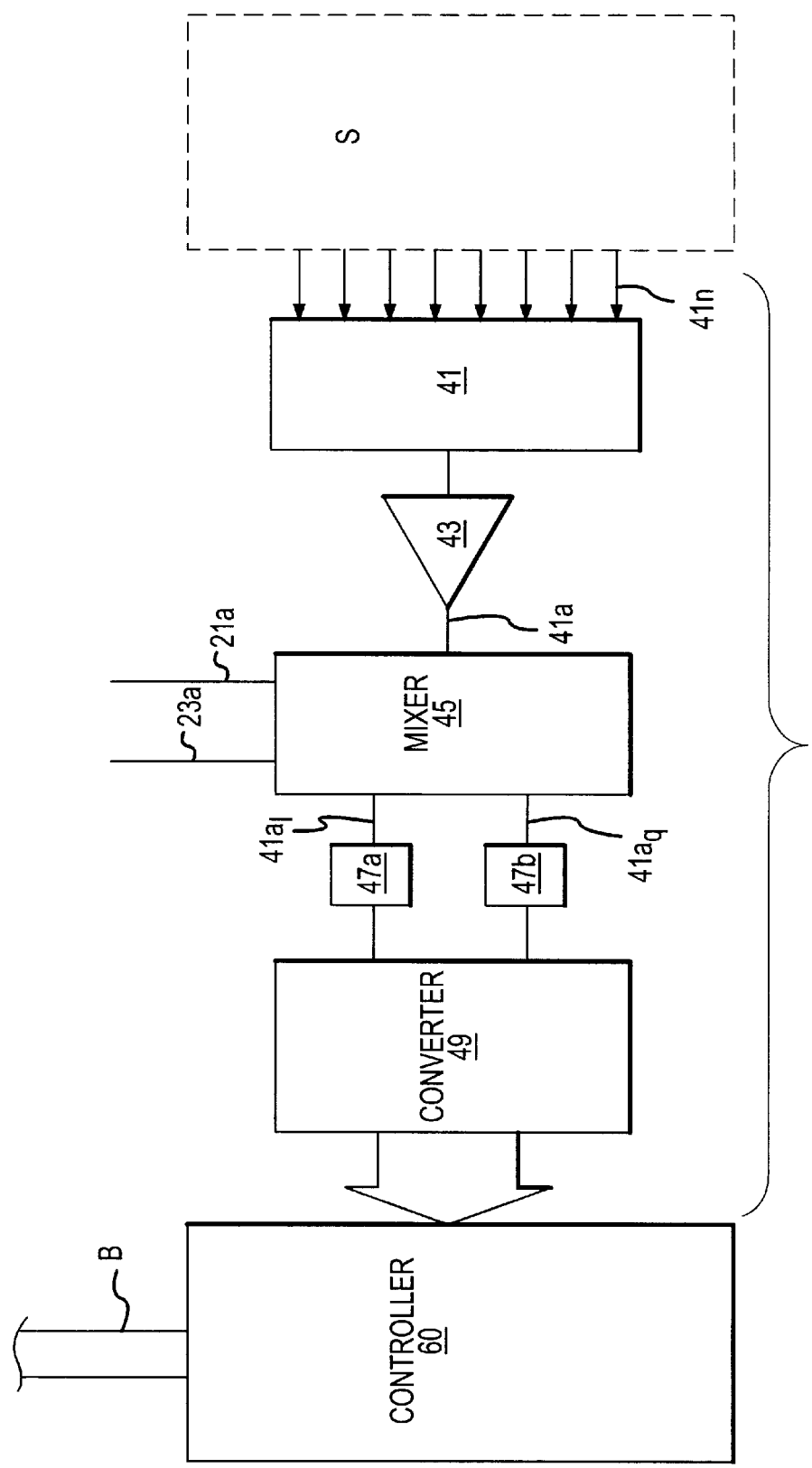
FIG. 3 is a graphical illustration of the means for receiving as disclosed and claimed in the present invention.

As seen in FIGS. 1–3, the present invention 10 is a method and apparatus for transmitting sinusoidal signals on one of a plurality of channels to a system and receiving corresponding response signals on one of a plurality of receive channels corresponding to various system operational characteristics. As seen in FIG. 2a and 2b, the present invention 10 includes a means for transmitting 20, a means for receiving 40 and a means for controlling 60.

As seen in FIG. 2, the means for transmitting 20 transmits at least one sinusoidal signal $27_n$ to the system S, or network, being analyzed. The means for transmitting 20 includes a first means for digital synthesizing 21, a second means for digital synthesizing 23, optional electronic means for signal conditioning 25, a multi-channel means for multiplexing 27, an optional output buffer 29, all in communication with the software means for controlling 60.

First means for digital synthesizing 21 produces a pure sinusoidal signal with a spurious free dynamic range of over 50 db, which prevents intermodulation from corrupting the result of extremely sensitive measurements of signal $41_n$ (shown in FIGS. 1 and 3) received from the system S. Preferably, first means for digital synthesizing 21 is capable of generating sinusoidal signals over a wide frequency range with low frequency tuning resolution, producing a square wave reference sinusoidal signal corresponding to the sinusoidal signal being generated, and generating an analog signal corresponding to the sine wave reference signal. A preferred first means for digital synthesizing 21, for example, is part number AD9851 sold by Analog Devices, which generates signals from a few hertz to over 60 megahertz, has a frequency tuning resolution of 0.04 Hz and outputs an analog reference signal 21a at a predetermined frequency. This resolution allows the measurement of received signals $41_n$ to a wide range of transmitted sinusoidal signals $27_n$.

Second means for digital synthesizing 23 also produces a pure sinusoidal signal with a spurious free dynamic range of over 50 db, generates sinusoidal signals over a wide frequency range with high frequency tuning resolution and produces an analog signal. The preferred second means for digital synthesizing 23 is the same synthesizer as the first means for digital synthesizing 21, which generates sinusoidal signals from a few hertz to over 60 megahertz and has a frequency tuning resolution of 0.04 Hz. However, the analog output signal 23a of second digital synthesizer 23 is phase shifted with regard to the reference analog signal 21a generated by the first means for digital synthesizing 21, thereby resulting in a phase-shifted frequency signal 23a. Preferably, frequency signal 23a is phase-shifted by 90 degrees resulting in a cosine signal. The phase-shifted frequency signal 23a is then transmitted to the means for receiving 40 (as seen in FIGS. 1 and 3) to allow the determination of phase information from the system S being analyzed as further described below.

The electronic means for signal conditioning 25 is optionally necessary depending on the type of digital synthesizer (21 or 23) employed. In the preferred embodiment of the present invention, device part number AD9851 outputs analog signals 21a, 23a. However, those of skill in the art will realize that output signals 21a, 23a employed in the preferred embodiment are current output signals, and further, that these signals are differential signals. Thus, signal 21a requires further refinement to reduce or eliminate DC offset and account for the proper amplification and voltage level for the proper transmission to the system S being analyzed. In one preferred embodiment of the present invention, a means for filtering electronics (not shown) is first employed to filter signal 21a to eliminate any remaining higher order harmonics and to produce a differential voltage signal. Then, a dual amplifier (not shown) is configured to amplify the signal, which is then transmitted to a high pass filter circuit resulting in a conditioned signal 25a to thereby eliminate any DC offset and to further provide a proper signal drive voltage level. Those skilled in the art will realize that numerous methods may exist in which to properly condition signal 21a by a means for filtering electronics which remain within the spirit and scope of this invention.

The conditioned signal 25a (or, signal 21a if the signal did not require conditioning) is then transmitted to a multi-channel means for multiplexing 27 which multiplexes signal 25a to the required channel or channels $27_n$ by the software means for controlling 60. In the preferred embodiment, means for multiplexing 27 is a MAX308 eight channel multiplexor sold by Maxim Industries. Each multiplexed signal $27_n$ is then controlled by the means for controlling 60 to be transmitted to an output buffer (not shown) such as an LM6182 manufactured by National Semiconductor, which can drive up to ½ watt of power and remain stable under capacitive loads. Each output buffer is optional, but is necessary in one preferred embodiment due to the internal series resistance found in the means for multiplexing 27 employed in the preferred embodiment. Such resistance needs to be isolated from the system S being analyzed to ensure accurate response measurements.

As shown in FIGS. 1–3, the software means for controlling 60 is stored on a computer means, is in communication with a communications bus B and is software employed to control (and therefore, is in communication with) the means for digital synthesizing 21, 23, the electronic means for signal conditioning 25, the multi-channel means for multiplexing 27, a multi-channel means for demultiplexing 41, a low noise means for amplifying 43, a means for mixing electronic signals 45, optional low pass filtering means 47a, 47b and a multi-channel, simultaneous sampling, means for converting signals 49. While those of skill in the art will come to realize that numerous software applications could be used to control these devices to achieve the same or similar results of those disclosed in this invention, the preferred embodiment of the present invention employs Labview control software (developed by National Instruments). In particular, the means for controlling 60 is programmed for stepped frequency modulation, continuous wave processing so that frequencies are discretely stepped over a predetermined frequency range and over a predefined frequency increment by programming tasks known in the art. Optimally, the means for controlling is programmed so that at each step, the means for controlling is programmed to dwell for a short time interval to allow for filter settling. At each interval, preselected measurements can be taken [such as, for example, the magnitide of the in-phase signal (I) and the quadrature signal (Q)) over a particular frequency sweep, which can then be stored, analyzed and displayed by the means for controlling 60 as needed. When the stepped programming is completed over the preselected frequencies, the frequency magnitude of each response signal $41_n$ can be calculated as $\sqrt{I^2+Q^2}$, the phase data of each response signal $41_n$ is computed as the arctan (Q/I), while the time domain impulse response of each response signal $41_n$ is computed by performing a complex inverse frequency transform, all techniques known to those of skill in the art. By executing such a frequency sweep at every frequency of interest, the spectral magnitude and phase information about system S is obtainable by employing the means for controlling 60. The inverse frequency transform can then be performed to yield an equivalent time domain response from system S.

As seen in FIG. 3, the means for receiving 40 includes a multi-channel means for demultiplexing 41, a low noise means for amplifying 43, a means for mixing electronic signals 45, optional low pass filtering means 47a, 47b and a multi-channel, simultaneous sampling, means for converting signals 49, all in communication with the means for controlling 60.

The means for demultiplexing 41, controlled by the software means for controlling 60, demultiplexes each receive signal $41_n$ resulting in a demultiplexed receive signal 41a. The ability to transform multiplexed signals to a demultiplexed signal by a conventional multiplexor circuit is well known in the art. As such, in this configuration, a plurality of transmit signals $27_n$ can be transmitted to a system S for analyzing, and the corresponding plurality of receive signals $41_n$ can be used to receive the signals from the system S, thereby allowing greater system flexibility. In the preferred embodiment, means for demultiplexing 41 is a MAX308 eight channel multiplexor circuitry manufactured by Maxim Industries.

The demultiplexed receive signal 41a is then transmitted to the means for amplifying 43 to increase the magnitude of signal 41a. The gain of means for amplifying 43 is optionally adjusted by the software means for controlling 60 to allow analysis of high or low level return signals. Means for amplifying 43 is low noise adjustable because, in certain cases, the received signal 41a will be near the system noise floor.

After receive signal 41a is amplified, it is transmitted to a means for electronically mixing signals 45 (such as, for example, a solid state mixer integrated circuit such as part number AD831) which executes a phase coherent mixing operation to obtain the rectangular format of the in-phase (I) and quadrature (Q) components of each signal, and extracts information pertaining to the phase and magnitude of the return signal 41a with respect to the transmitted signals 21a and 23a. To obtain the I and Q components, the receive signal 41a is divided into multiple signals by the means for electronically mixing signals 45, and preferably, two signals $41a_I$ and $41a_Q$. Means for electronically mixing signals 45 electronically mixes in-phase signal $41a_I$ with sine wave transmit signal 21a, and further, electronically mixes quadrature signal $41a_Q$ with cosine wave transmit signal 23a. Software means for controlling 60 obtains receive signal 41a from the system S which is either an inverted or non-inverted signal, depending on the state of the transmitted reference signals 21a or 23a. Thus, for example, when the reference square wave signal 21a is low, the receive signal 41a is non-inverted. When the reference square wave signal 21a is high, the receive signal 41a is inverted. The mixing of receive signal 41a with the reference sine wave signal 21a and with the reference cosine wave signal 23a is accomplished by hardware configuring the means for electronically mixing signals 45 to select the reference sine wave signal 21a or the reference cosine wave signal 23a. This mixing process is analogous to a radio frequency (RF) mixer where an RF signal is sequentially inverted or not inverted by transmitting saturating local oscillator current through a set of ring connected switching diodes. Thus, according to the present invention, the mixing produces a frequency translation which produces the difference of the transmit signal and the received signal.

Preferably, as seen in FIG. 1, both in-phase signal $41a_I$ and quadrature signal $41a_Q$ are next processed through low pass filtering means 47a, 47b to condition both signals so that each signal has a frequency content which represents the difference of the two mixer signals. Thus, the transmitted reference signal is mixed with the received signal to produce an output signal which is the difference between the transmitted reference signal and the received signal. While other methods may exist to obtain the same type of signals, such methods may be deficient. For example, analog multipliers typically suffer from generating high DC drift signals while offering low dynamic range. The present invention solves such deficiencies. In any case, the component I and Q can thereafter easily be mathematically transformed into polar phase and magnitude format by means well known in the art for further computational processing by the means for controlling 60.

Next, in-phase signal $41a_I$ and quadrature signal $41a_Q$ are both transmitted to a multi-channel, simultaneous sampling, means for converting signals 49 to produce a signal 49a for processing by the means for controlling 60. Preferably, means for converting signals 49 is capable of converting an analog signal to a high resolution digital signal for processing by the means for controlling 60. A representative means for converting signals 49 includes a MAX125 (sold by Maxim Industries), which has the capability to accurately and simultaneously sample up to four input signals, and rapidly convert each of these signals to a fourteen bit resolution digital representation. While the present invention only requires use of two input signals to the means for converting signals 49, the other inputs could be used to sample a higher bandwidth signal if desired (since using a higher bandwidth allows for a faster scan rate, but less signal range above the noise floor—thus, if more time is selected, lower voltage signals can be recovered).

Other variations and modifications of the present invention will be apparent to those of ordinary skill in the art, and it is the intent of the appended claims that such variations and modifications be covered. The particular values and configurations discussed above can be varied, are cited to illustrate particular embodiments of the present invention and are not intended to limit the scope of the invention. It is contemplated that the use of the present invention can involve components having different characteristics as long as the principle, the presentation of a multi-channel network analyzer, is followed.

What is claimed is:

1. A method for real-time analysis of a system, comprising the steps of:
   a. providing a means for controlling, the means for controlling storable and executable on a computer means having a memory storage device;
   b. generating at least one phase transmit signal and at least one phase-shifted transmit signal by a means for transmitting in communication with the means for controlling, the means for transmitting communicating each phase transmit signal to the system, the means for transmitting having a first means for digital synthesizing in communication with the means for controlling, a second means for digital synthesizing in communication with the means for controlling and a multi-channel means for multiplexing in communication with the first means for digital synthesizing and the system;
   c. obtaining at least one response signal from the system by a means for receiving, each response signal corresponding to each phase transmit signal, the means for receiving in communication with the means for controlling and the system;
   d. mixing the phase transmit signal and the phase-shifted transmit signal with each corresponding response signal to produce a mixed signal;
   e. transmitting the mixed signal to the means for controlling; and
   f. allowing the means for controlling to execute a stepped frequency sweep of the mixed signal over a predetermined frequency range, the means for controlling generating frequency information from each mixed signal, phase information from each mixed signal and time domain information from each mixed signal.

2. The method of claim 1, the means for receiving further comprising a multi-channel means for demultiplexing in communication with the system, a means for amplifying in communication with the means for demultiplexing, a means for mixing electronic signals in communication with the means for amplifying and the means for transmitting, and a means for converting signals in communication with the means for mixing electronic signals and the means for controlling.

3. The method of claim 2 wherein the means for receiving further comprises a filtering means in communication with the means for mixing electronic signals and the means for converting signals.

4. The method of claim 3 further comprising the step of allowing the means for electronically mixing signals to generate an in-phase response signal and a quadrature response signal from each response signal, the in-phase response signal generated by electronically mixing each phase transmit signal with each response signal, the quadrature response signal generated by electronically mixing the phase-shifted transmit signal with each response signal.

5. The method of claim 4 wherein the phase transmit signal is a sinusoidal signal and the phase-shifted transmit signal is a cosinusoidal signal.

6. The method of claim 5 further comprising the step of transmitting each in-phase response signal and each quadrature response signal to a filtering means prior to transmitting each in-phase response signal and each quadrature response signal to the means for converting signals.

7. The method of claim 6 further comprising the step of transmitting each phase transmit signal to an electronic means for signal conditioning prior to transmitting each phase transmit signal to the means for multiplexing.

8. The method of claim 7, the means for controlling comprising a software program means for stepped frequency modulation, continuous wave processing.

9. A method for real-time monitoring of processes on a system comprising the steps of:
   a. introducing a means for controlling executable on a personal computer means;
   b. generating at least one sinusoidal transmit signal by a means for transmitting, the means for transmitting in electrical communication with the means for controlling and the system;
   c. generating at least one cosinusoidal transmit signal by the means for transmitting;
   d. receiving at least one response signal from the system by a means for receiving, each response signal corresponding to each sinusoidal transmit signal and including operational state data from the system, the means for receiving in electrical communication with the means for controlling and the system;
   e. electronically mixing each sinusoidal transmit signal with each response signal to obtain an in-phase response signal;
   f. electronically mixing each cosinusoidal transmit signal with each response signal to obtain a phase-shifted response signal;
   g. transmitting the in-phase response signal and the phase-shifted response signal to a means for converting signals, the means for converting signals generating a high-resolution digital output signal; and
   h. transmitting the digital output signal to the means for controlling to execute a stepped frequency sweep of the digital output signal over a predetermined frequency range, the means for controlling generating frequency information, phase information and time domain information from each digital output signal.

10. The method of claim 9 wherein the means for transmitting further comprises a first means for digital synthesizing in communication with the means for controlling, a second means for digital synthesizing in communication with the means for controlling and a multi-channel means for multiplexing in communication with the first means for digital synthesizing and the system.

11. The method of claim 10 wherein the means for receiving further comprises a multi-channel means for demultiplexing in communication with the system, a means for amplifying in communication with the means for demultiplexing, a means for mixing electronic signals in communication with the means for amplifying and the means for transmitting, a filtering means in communication with the means for mixing electronic signals, and a means for converting signals in communication with the filtering means and the means for controlling.

12. The method of claim 11, the means for controlling comprising a software program means for stepped frequency modulation, continuous wave processing.

13. A network analyzer for a system comprising:
   a. a multi-channel means for transmitting having a first means for digital synthesizing and a second means for digital synthesizing, the first means for digital synthesizing generating at least one phased signal and transmitting each phased signal to the system to obtain at least one receive signal from the system corresponding to the operational status of the system, the second means for digital synthesizing generating a phase-shifted signal;
   b. a multi-channel means for receiving having a means for electronically mixing signals, the means for electronically mixing signals phase coherently mixing the phased signal with each receive signal to obtain an in-phase response signal, the means for electronically mixing signals phase coherently mixing the phase-shifted signal with each receive signal to obtain a quadrature response signal; and c. a means for controlling in communication with the means for transmitting and the means for receiving, the means for controlling executing a stepped frequency sweep of the in-phase response signal and the quadrature response signal over a predetermined frequency range, the means for controlling generating frequency information, phase information and time domain information.

14. The network analyzer of claim 13 wherein the multichannel means for receiving further comprises a multichannel means for demultiplexing in communication with the system, a means for amplifying in communication with the means for demultiplexing, a filtering means in communication with the means for mixing electronic signals, and a means for converting signals in communication with the filtering means and the means for controlling.

15. The network analyzer of claim 14, the means for controlling comprising a software program means for stepped frequency modulation, continuous wave processing.

16. The network analyzer of claim 15 wherein first means for digital synthesizing generates signals up to approximately 60 MHz with a tuning resolution of 0.04 Hz, and the second means for digital synthesizing generates signals up to approximately 60 MHz with a tuning resolution of 0.04 Hz.

17. The network analyzer of claim 16 wherein the phased signal is a sinusoidal signal and the phase-shifted signal is a cosinusoidal signal in reference to the sinusoidal signal.

18. The network analyzer of claim 17 wherein the means for converting signals generates a high-resolution digital output signal.

* * * * *